(12) United States Patent
Sousa (10) Patent No.: US 9,774,341 B1
(45) Date of Patent: Sep. 26, 2017

(54) DYNAMIC TRIGGERING AND SAMPLING ENGINE (DTSE) FOR LOW-LATENCY AND COST EFFECTIVE CONTROL SYSTEMS

(71) Applicant: Active-Semi, Inc., Tortola (VG)

(72) Inventor: Marc D. Sousa, McKinney, TX (US)

(73) Assignee: Active-Semi, Inc. (VG)

( * ) Notice: Subject to any disclaimer, the term of this patent is extended or adjusted under 35 U.S.C. 154(b) by 0 days.

(21) Appl. No.: 15/427,034

(22) Filed: Feb. 7, 2017

(51) Int. Cl.
| H03M 1/12 | (2006.01) |
| G06F 13/42 | (2006.01) |
| G06F 13/24 | (2006.01) |
| H02P 6/18 | (2016.01) |

(52) U.S. Cl.
CPC .......... *H03M 1/1245* (2013.01); *G06F 13/24* (2013.01); *G06F 13/4282* (2013.01); *H02P 6/18* (2013.01)

(58) Field of Classification Search
CPC .......................... H03M 1/1245; G06F 13/4282
USPC .................................. 341/122, 155, 160, 114
See application file for complete search history.

(56) References Cited

U.S. PATENT DOCUMENTS

2005/0219103 A1* 10/2005 Ogawa ................. H03M 1/1225
341/155
2011/0102221 A1* 5/2011 Guido ................. H03M 1/1225
341/141

* cited by examiner

*Primary Examiner* — Peguy Jean Pierre
(74) *Attorney, Agent, or Firm* — Imperium Patent Works; Mark D. Marrello; Amir V. Adibi

(57) ABSTRACT

A Dynamic Triggering and Sample Engine (DTSE) that detects a first trigger received on a trigger input terminal that triggers a series of analog-to-digital conversions to be completed by an analog-to-digital converter circuit. The DTSE then determines a first sequence configuration stored in a sequence configuration table that is associated with the first trigger, causes a first analog-to-digital conversion to be performed using the first sequence configuration; causes a first analog-to-digital conversion result value to be stored in a sequence result table; and outputs an interrupt to a processor indicating that the first analog-to-digital conversion result value is available in the sequence result table. The interrupt is output from the DTSE before all remaining analog-to-digital conversions in the series are completed. In response to receiving the interrupt, the processor reads the analog-to-digital result value from the sequence result table via a bus.

18 Claims, 11 Drawing Sheets

ANALOG-TO-DIGITAL CONVERTER WITH
DYNAMIC TRIGGERING AND SAMPLE ENGINE (DTSE)

(PRIOR ART)
FIG. 1

CONTROLLER WITHOUT AUTO-SEQUENCER

FIG. 2

CONTROLLER WITH AUTO-SEQUENCER

FIG. 3

ANALOG-TO-DIGITAL CONVERTER WITH
DYNAMIC TRIGGERING AND SAMPLE ENGINE (DTSE)

FIG. 4

DYNAMIC AND TRIGGERING AND SAMPLE ENGINE
(DTSE)

FIG. 5

CONTROLLER WITH DYNAMIC TRIGGERING AND
SAMPLE ENGINE (DTSE)
FIG. 6

| TRIGGERED INPUT | SEQUENCE CONFIG TABLE ENTRY NUMBER |
|---|---|
| 1 | 1 |
| 2 | 1 |
| 3 | 1 |
| 4 | 6 |
| 5 | 6 |
| 6 | 12 |
| 7 | 12 |
| 8 | 18 |

THE TRIGGER MAPPING TABLE MAPS THE INPUT TRIGGER TO AN ENTRY IN THE SEQUENCE CONFIGURATION TABLE.

TRIGGER MAPPING TABLE

FIG. 7

| SEQUENCE CONFIG TABLE ENTRY NUMBER | ADC CONVERSION | IRQ (INTERRUPT) | SIGNALING (METADATA) | SEQUENCE COMPLETE? |
|---|---|---|---|---|
| 1 | ADC0 | NONE | EMUX CHG | NO |
| 2 | ADC0 | NONE | EMUX CHG | NO |
| 3 | ADC0 | IRQ0 | EMUX CHG | NO |
| 4 | ADC3 | NONE | NONE | NO |
| 5 | ADC4 | NONE | NONE | YES |
| 6 | ADC5 | IRQ2 | NONE | NO |
| 7 | ADC6 | NONE | NONE | NO |
| 8 | ADC7 | NONE | NONE | YES |

EACH SEQUENCE CONFIGURATION TABLE ENTRY CAN INCLUDE AN ADC INSTRUCTION, AND INTERRUPT INSTRUCTION, A SIGNALING INSTRUCTION AND A SEQUENCE COMPLETE INSTRUCTION.

SEQUENCE CONFIG TABLE

FIG. 8

| SEQUENCE CONFIG TABLE ENTRY NUMBER | ADC RESULT |
|---|---|
| 1 | ADC RESULT (ADC0) |
| 2 | ADC RESULT (ADC0) |
| 3 | ADC RESULT (ADC0) |
| 4 | ADC RESULT (ADC3) |
| 5 | ADC RESULT (ADC4) |
| 6 | ADC RESULT (ADC5) |
| 7 | ADC RESULT (ADC6) |
| 8 | ADC RESULT (ADC7) |

AN ADC RESULT IS STORED FOR EACH SEQUENCE RESULT TABLE ENTRY IN THE SEQUENCE RESULT TABLE.

SEQUENCE RESULT TABLE

FIG. 9

TRIGGER MAPPING STATE MACHINE
FIG. 10

SEQUENCE ENTRY STATE MACHINE
FIG. 11

FLOWCHART OF DTSE OPERATION
FIG. 12

DYNAMIC TRIGGERING AND SAMPLING ENGINE (DTSE) FOR LOW-LATENCY AND COST EFFECTIVE CONTROL SYSTEMS

TECHNICAL FIELD

The present disclosure relates generally to control systems, and more specifically to a controller including a Dynamic Triggering and Sampling Engine (DTSE).

BACKGROUND INFORMATION

Control systems must meet complex design requirements when sampling analog signals, such as, current, voltage or temperature. One example in which analog signals, such as, current, voltage and temperature are required to be sampled is in a Brushless Direct-Current (BLDC) electric motor controller. Another example in which these analog signals are required to be sampled is in a Permanent-Magnet Synchronous Motor (PMSM) controller. These analog signals are also required to be sampled in motor controllers and digitally controlled power supplies. Traditional controllers require a designer to choose between high performance at a high cost, or reduced performance at an economical price. A high performance solution that can be implemented at an economical price is needed.

SUMMARY

In a first novel aspect, a Dynamic Triggering and Sample Engine (DTSE), includes a hardware trigger input, a bus terminal, a memory that stores a trigger mapping table, a sequence configuration table, a sequence result table, and a state machine. The state machine is configured to: detect a first trigger received on the hardware trigger input (the first trigger triggers a series of analog-to-digital conversions to be completed by an analog-to-digital converter circuit); determine a first sequence configuration stored in the sequence configuration table that is associated with the first trigger; cause one of the first analog-to-digital conversions to be performed using the first sequence configuration; cause a first analog-to-digital conversion result value to be stored in the sequence result table; and output an interrupt indicating that the first analog-to-digital conversion has been completed by the analog-to-digital circuit. In one example, the interrupt is output before at least one of the remaining analog-to-digital conversions in the series is completed. The state machine may be implemented using combinatory logic or may be implemented using a microcontroller.

In one example, the series of analog-to-digital conversions includes critical samples and non-critical samples, and at least one of the critical samples is completed before at least one of the non-critical samples. The interrupt is output after at least one of the critical samples of the series of analog-to-digital conversions is completed.

In a second novel aspect, a method of dynamic triggering, includes: detecting a first trigger received on a hardware trigger input, where the first trigger triggers a series of analog-to-digital conversions to be completed by an analog-to-digital converter circuit; determining a first sequence configuration stored in a sequence configuration table that is associated with the first trigger; causing a first analog-to-digital conversion to be performed using the first sequence configuration; causing a first analog-to-digital conversion result value to be stored in a sequence result table; and outputting an interrupt indicating that the first analog-to-digital conversion result value is available in the sequence result table. The interrupt is output before at least one of the analog-to-digital conversions in the series is completed.

In one example, the method of dynamic triggering further includes: determining a first portion of the series of analog-to-digital conversions that are critical conversions; determining a second portion of the series of analog-to-digital conversions that are non-critical conversions; and outputting the interrupt after at least one of the critical conversions are completed and before the non-critical conversions are completed.

The foregoing is a summary and thus contains, by necessity, simplifications, generalizations and omissions of detail; consequently it is appreciated that the summary is illustrative only. Still other methods, and structures and details are set forth in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

DETAILED DESCRIPTION

In a traditional controller, the speed at which multiple analog signals can be sampled affects multiple aspects of the device under control. For example, the control of a BLDC or PMSM motor is greatly affected by the speed at which the motor controller can sample multiple analog signals. First, the sampling speed affects the speed at which the motor controller can turn the motor. Second, the sampling speed affects the resolution at which the controller can control the speed and torque of the BLDC or PMSM motor. Third, the sampling speed affects the resolution at which the controller can control the precise output voltage of a power supply device Latency of the analog signal sampling is an important performance characteristic of a controller. If the latency of the analog signal sampling is too great, then the accuracy of the analog sampling is reduced. A reduction of analog sampling accuracy will not only negatively affect the ability of the controller to accurately control the motor or power supply, it may also affect the value of the end product and possibly cause an unsafe end product.

Figure 1:
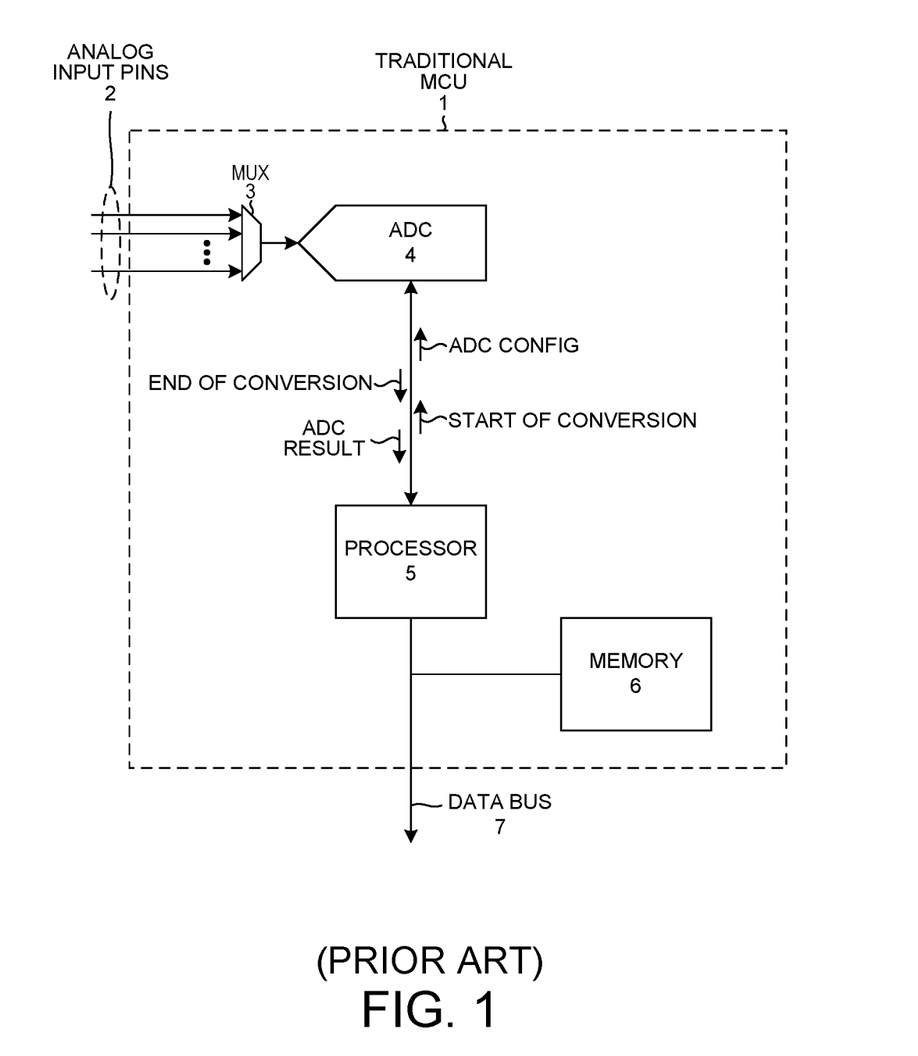
FIG. 1 is a diagram of a traditional controller.

FIG. 1 is a diagram of a traditional MCU 1 without an auto-sequencer. The traditional MCU 1 includes analog input pins 2, multiplexer (MUX) 3, analog-to-digital converter (ADC) 4, processor 5, memory 6 and data bus 7. In operation, the multiplexer 3 receives one or more analog signals via the analog input pins 2 and outputs a selected one of the analog signals to the input terminal of ADC 4. ADC 4 then converts the analog signal into a digital value that represents the amplitude of the analog signal (ADC RESULT). In one example, the amplitude of the analog signal is measured in volts for voltage. In another example, the amplitude of the analog signal is measured in amperes for current. The ADC 4 is configured by the processor 5 via ADC CONFIG data. The processor 5 starts the ADC process by sending a START OF CONVERSION signal to the ADC 4. In response to receiving the START OF CONVERSION signal from the processor, the ADC 4 performs the analog-to-digital conversion. When the conversion is complete, the ADC 4 sends an END OF CONVERSION signal to the processor 5 indicating that the conversion is complete. The processor 5 then is required to perform the additional operation of reading the ADC result from the ADC 4 and storing the ADC result into the memory 6. An external system then is able to read the ADC result via data bus 7. Once the ADC result is stored in memory 6, the processor 5 has to start the process over again to sample another analog signal.

Figure 2:
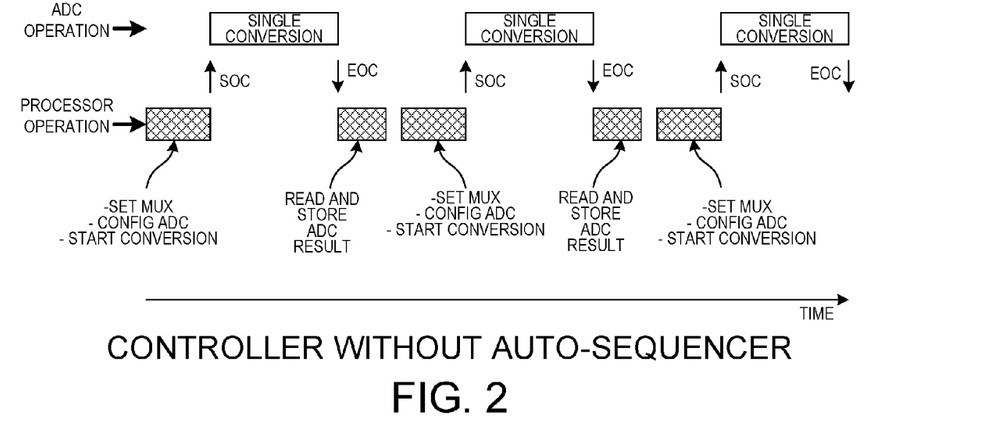
FIG. 2 is a diagram illustrating the operation of a controller without an auto-sequencer.

The operation of the traditional controller without an auto-sequencer is illustrated in FIG. 2. First the processor 5 must set the multiplexer 3 to select the desired analog signal, send ADC CONFIG data to the ADC 4, and then send the START OF CONVERSION signal to the ADC 4. The ADC 4 then starts the conversion of the single selected analog signal. Once the single conversion is completed, the ADC 4 sends an END OF CONVERSION signal to the processor 5. In response to receiving the END OF CONVERSION signal, the processor 5 is required to read the ADC result from the ADC 4 and store the ADC result in the memory 6. Only once the processor 5 has finished the write operation of the ADC result to the memory 6, can the processor 5 begin to repeat the process for the next desired analog signal by resetting the multiplexer 3 and sending new ADC CONFIG data to setup the ADC 4 for the next conversion. FIG. 2 illustrates that a controller without auto-sequencer can only convert one analog signal without requiring additional communication with, and processing by, the processor 5. This controller requires too many processor cycles for each analog conversion performed for high performance control applications.

Figure 3:
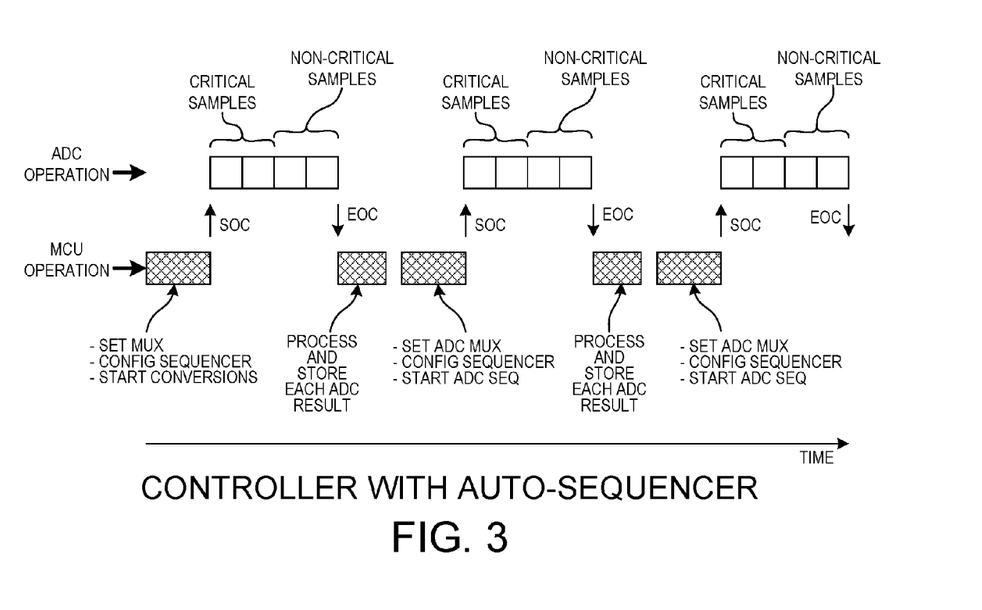
FIG. 3 is a diagram illustrating the operation of a controller with an auto-sequencer.

FIG. 3 is a diagram illustrating the operation of a controller with an auto-sequencer. A more advanced type of controller includes a processing engine (MCU) and an auto-sequencer. An auto-sequencer allows multiple analog channels to be converted sequentially as shown in FIG. 3. Some of the analog channels are determined to be "critical samples" and other analog channels are determined to be "non-critical samples". The MCU must set the multiplexer 3 to output the desired analog signal, configure the ADC 4, and configure the auto-sequencer to start performing the desired conversions in the desired order. The MCU then sends the START OF CONVERSION signal to the ADC 4 to start the conversion sequence. In response to receiving the START OF CONVERSION signal, the ADC 4 performs each of the desired conversions sequentially. Once the final conversion is completed, the ADC 4 sends an END OF CONVERSION signal to the MCU. In response to receiving the END OF CONVERSION signal, the MCU must read the multiple ADC results from the ADC 4 and then store the ADC results in memory 6 and perform the necessary processing on the multiple ADC results to properly control the motor or power supply.

The controller with an auto-sequencer is an improvement over the traditional controller as the controller with auto-sequencing reduces the number of MCU cycles required for each analog sample. However, the controller with auto-sequencing still suffers from multiple drawbacks. A control system usually has a set of analog samples that are critical to the functioning of the control system and another set of analog samples that are non-critical to the functioning of the control system. For example, the motor current in the case of motor controller and output voltage in the case of power supplies are analog samples that are critical to proper operation of the device under control. Alternatively, temperature is an example of a non-critical analog sample. Ideally, the non-critical analog samples would be processed without causing any delay in the processing of critical analog samples. The controller with auto-sequencing illustrated in FIG. 3 cannot process critical analog samples until all of the non-critical samples have been completed. This system does not provide real-time availability of critical analog samples to the MCU for processing and causes latency from when the analog signals are sampled and when the MCU is able to process the analog samples. An improved solution is needed to provide reduced latency in the processing of critical analog samples.

Figure 4:
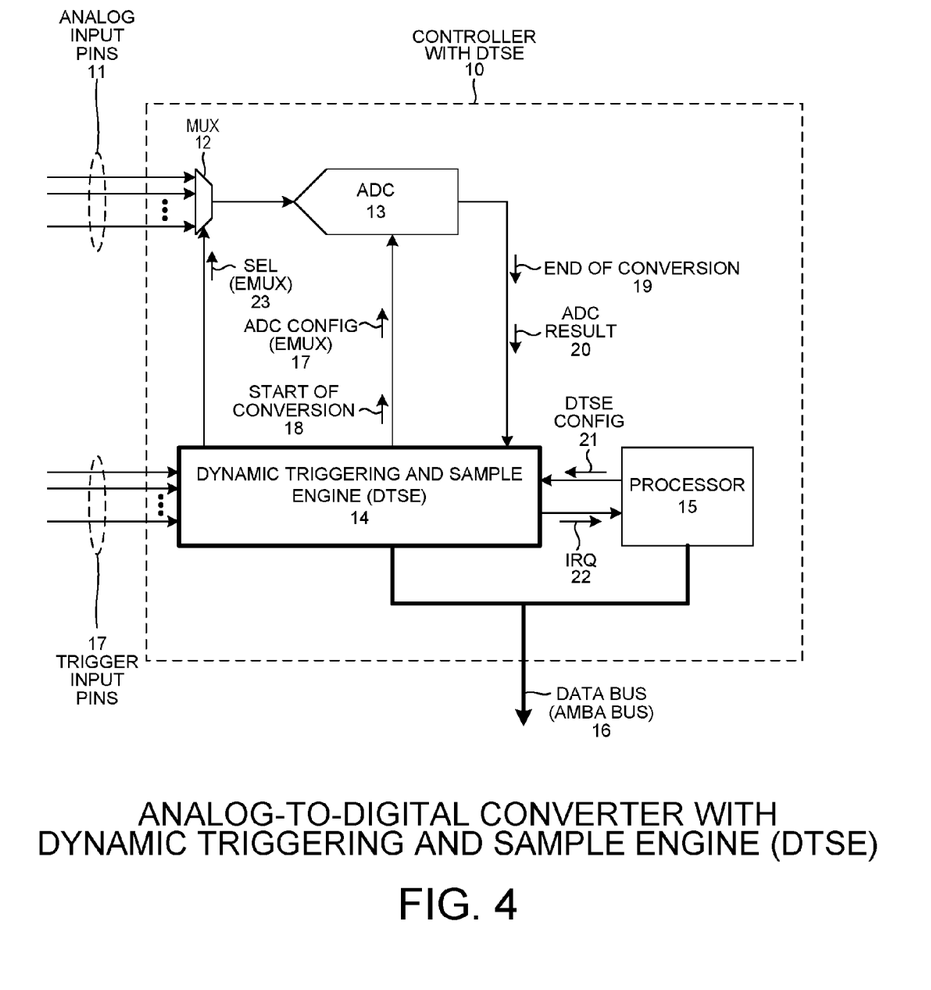
FIG. 4 is a diagram of a controller including a Dynamic Triggering and Sample Engine (DTSE).
Figure 5:
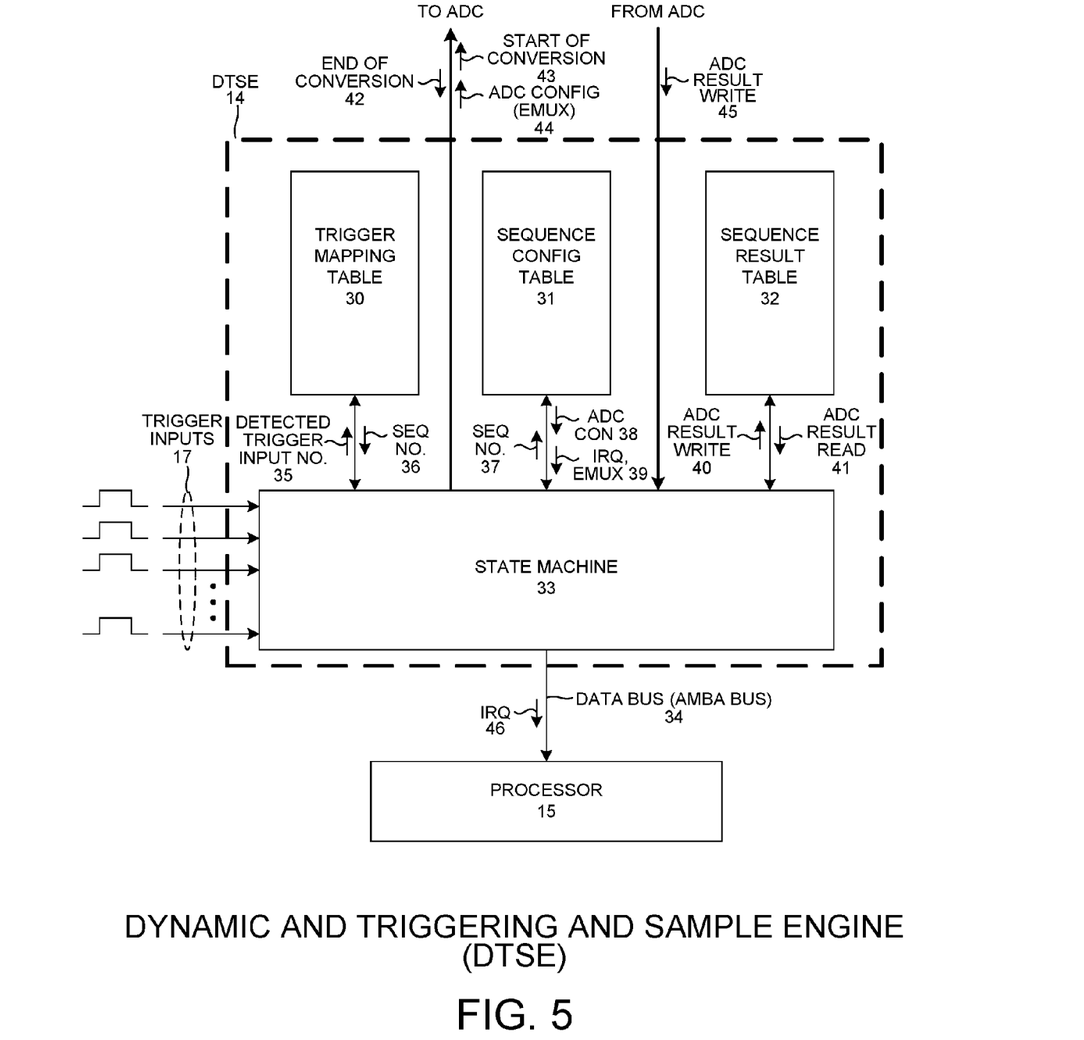
FIG. 5 is a more detailed diagram the DTSE of FIG. 4.

FIG. 4 is a diagram of a controller with a Dynamic Triggering and Sample Engine (DTSE). Controller with DTSE 10 includes multiple analog inputs pins 11, multiplexer 12, analog-to-digital (ADC) 13, DTSE 14, processor 15 (optionally included), data bus 16, and trigger inputs 17. In one example, the DTSE 14 includes thirty-two input hardware triggers. The triggers may be any signal, such as Pulse Width Modulated (PWM), Timer Capture and Compare (CCR), software trigger or the like. The trigger inputs may be analog or digital signals. FIG. 5 is a more detailed diagram the DTSE 14 of FIG. 4. The DTSE 14 includes a trigger mapping table 30, a sequence configuration table 31, a sequence result table 32, and a state machine 33. The state machine 33 may be implemented using combinatory logic or may be implemented using a microcontroller.

It is noted herein that FIG. 4 is an illustration of example embodiment of the present invention where the DTSE 14 is fabricated on a single integrated circuit that also includes an analog-to-digital converter circuit and a processor circuit. In other embodiments, the DTSE 14 may be fabricated on a dedicated integrated circuit, where the analog-to-digital converter circuit is located on a separate integrated circuit, and the processor circuit is located on a separate integrated circuit. In another example, the DTSE 14 may be fabricated on an integrated circuit that also includes an analog-to-digital circuit or a processor circuit.

Figure 7:
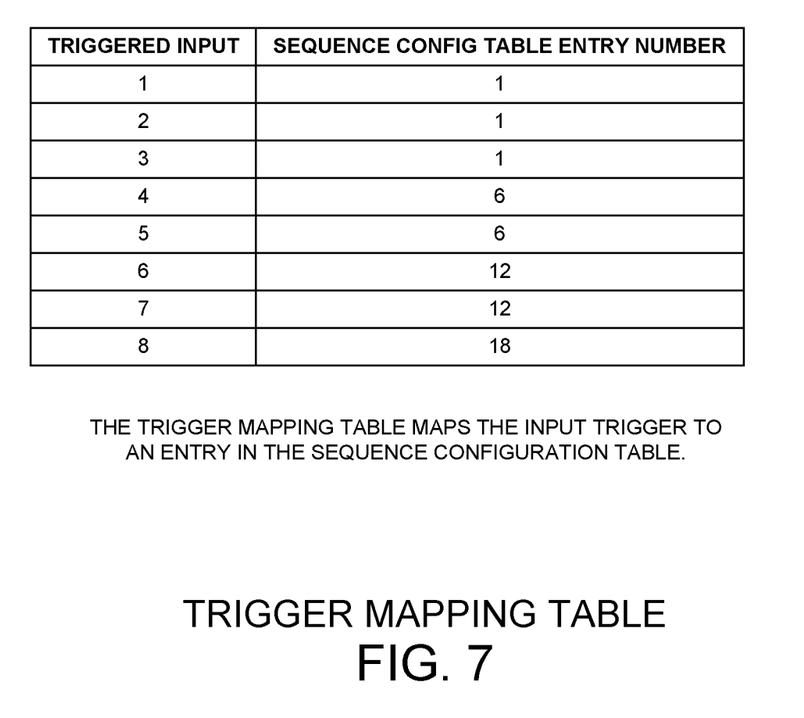
FIG. 7 is a diagram illustrating a Trigger Mapping Table.

FIG. 7 is a diagram of the trigger mapping table. The trigger mapping table includes a sequence configuration table entry number for each trigger input. In the event that trigger input number one is triggered, then the trigger mapping table indicates a sequence configuration table entry number of one. In the event that the trigger input number two is triggered, then the trigger mapping table indicates a sequence configuration table entry number of one. In the event that the trigger input number three is triggered, then the trigger mapping table indicates a sequence configuration table entry of one. In the event that the trigger input number four is triggered, then the trigger mapping table indicates a sequence configuration table entry of six. In the event that the trigger input number five is triggered, then the trigger mapping table indicates a sequence configuration table entry of six. In the event that the trigger input number six is triggered, then the trigger mapping table indicates a sequence configuration table entry of twelve. In the event that the trigger input number seven is triggered, then the trigger mapping table indicates a sequence configuration table entry of twelve. In the event that the trigger input number eight is triggered, then the trigger mapping table indicates a sequence configuration table entry of eighteen. In this fashion, the trigger mapping table can point multiple input trigger events to the same or different sequence configuration table entries. This provides memory savings in that redundant storage of sequence configurations are avoided. Rather, two separate trigger inputs that require the same sequence configuration can point to the same sequence configuration. For example, in the event that trigger inputs one, two and three all are for the same BLDC or PMSM motor, each triggering event would require the same sequence configuration to measure the same analog samples from each electrical motor. In this scenario, there is no need to store duplicate copies of the single sequence configuration.

Figure 8:
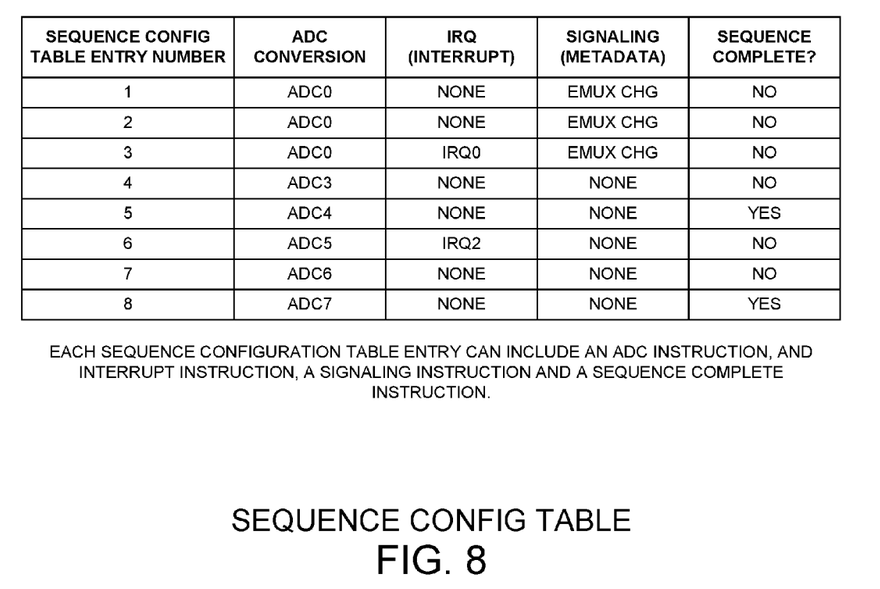
FIG. 8 is a diagram illustrating a Sequence Configuration Table.

FIG. 8 is a diagram of the sequence configuration table. The sequence configuration table includes an ADC conversion channel, an interrupt (IRQ) value, a signaling (EMUX) value, and a sequence complete indicator for each sequence configuration table entry number. In one example, the EMUX value may indicate a required change to the settings of the ADC multiplexer 12 (shown in FIG. 4). In another example, the EMUX value may indicate sample and hold time for ADC operation. In the event that the trigger mapping table outputs a sequence configuration table entry number one, the sequence configuration table indicates that an analog-to-digital conversion is to be performed on channel 0 (ADC0), that an interrupt (IRQ) is not to be performed, that external signaling (EMUX) is to be performed, and that the sequence is not completed. In the event that the trigger mapping table outputs a sequence configuration table entry number five, the sequence configuration table indicates that an analog-to-digital conversion is to be performed on channel 4 (ADC4), that an interrupt (IRQ) is not to be performed, that external signaling (EMUX) is not to be performed, and that the sequence is completed. In this fashion, the sequence configuration table provides all the necessary configurations to perform a predetermined analog-to-digital conversion sequence.

Figure 9:
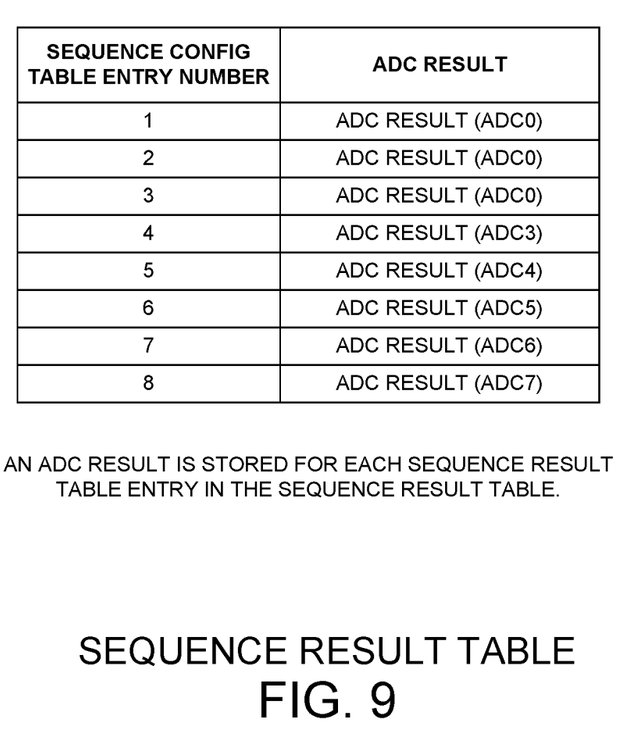
FIG. 9 is a diagram illustrating a Sequence Result Table.

FIG. 9 is a diagram of the sequence result table. The sequence result table includes an analog-to-digital (ADC) result for each sequence configuration table entry number. In the event that the trigger mapping table outputs a sequence configuration table entry number one, the sequence result table stores the analog-to-digital conversion performed on channel 0 (ADC0) in the corresponding ADC result field in the sequence result table. In the event that the trigger mapping table outputs a sequence configuration table entry number five, the sequence result table stores the analog-to-digital conversion performed on channel 4 (ADC4) in the corresponding ADC result field in the sequence result table. This one to one mapping of sequence configuration table entry numbers in the sequence configuration table and the sequence result table alleviates the need for a Direct Memory Access (DMA) design or a large number of transistors to perform a DMA-like hardware memory storage without the use of the MCU. The user may configure the Sequence Entry Table and the Sequence Result Table to arrange the results optimally for the MCU and application. The MCU has the ability to read from the sequence result table at any time.

In one example, DTSE 14 is configured by processor 15 via DTSE CONFIG signal 21. DTSE CONFIG includes values stored in the various tables within the DTSE 14. In another example, the DTSE 14 can be configured by an external device that communicates a DTSE CONFIG signal 21 to the DTSE 14 via data bus 16.

In operation, the DTSE 14 receives multiple trigger input signals via trigger input pins 17. The DTSE monitors the signal present on each trigger input pin. The DTSE 14 detects a triggering event on any of the trigger input pins. In one example, a high-to-low voltage transition is defined as a triggering event. In another example, a low-to-high voltage transition is defined as a triggering event. In yet another example, both a high-to-low and a low-to-high transition is defined as a triggering event. As discussed above, regarding FIG. 7, the DTSE 14 uses the trigger mapping table to determine a sequence configuration table entry number based on the triggered input.

Figure 10:
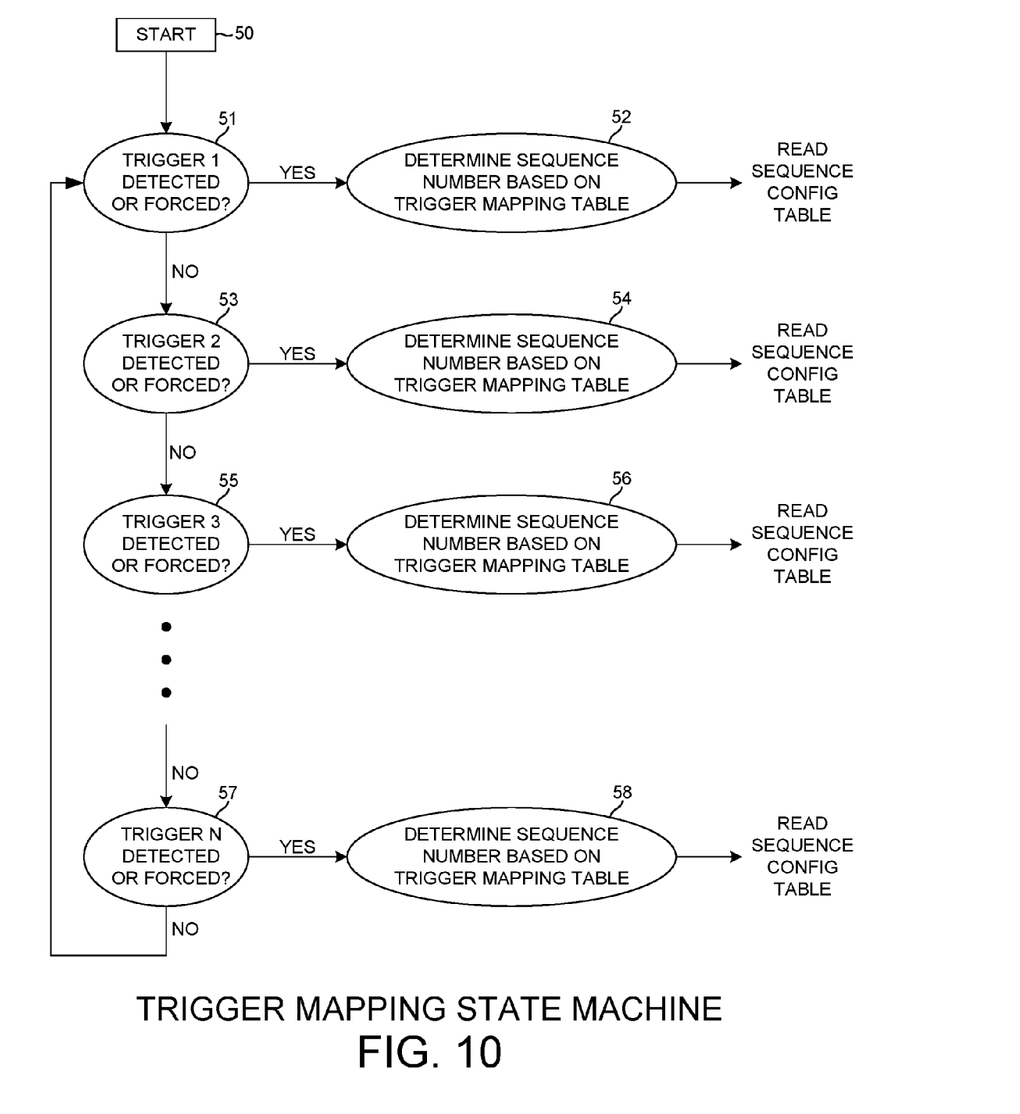
FIG. 10 is a state machine diagram illustrating the operation of a Triggering mapping State Machine performed by the DTSE.

The process performed by the trigger mapping state machine is illustrated in FIG. 10. The state machine starts at step 50. In step 51, the trigger mapping state machine determines if a triggering event is detected on input number one. If a triggering event is detected, then a sequence number is determined based on the trigger mapping table in step 52. In one example, step 52 involves a lookup operation wherein the sequence number is returned based on the trigger input on which a triggering event was detected. In response to determining the sequence number, the state machine reads the sequence configuration values from the sequence configuration table that correspond to the sequence number. If a triggering event is not detected at step 51, then the state machine determines if a triggering event is detected on trigger input two in step 53. If a triggering event is detected, then a sequence number is determined based on the trigger mapping table in step 54. In response to determining the sequence number, the state machine reads the sequence configuration values from the sequence configuration table that correspond to the sequence number. If a triggering event is not detected at step 53, then the state machine determines if a triggering event is detected on trigger input three in step 55. If a triggering event is detected, then a sequence number is determined based on the trigger mapping table in step 56. In response to determining the sequence number, the state machine reads the sequence configuration values from the sequence configuration table that correspond to the sequence number. The trigger mapping state machine continues in this fashion until each trigger input is checked. Once the last trigger input is checked for a triggering event, the trigger mapping state machine returns to step 51 and begins the process anew.

Figure 11:
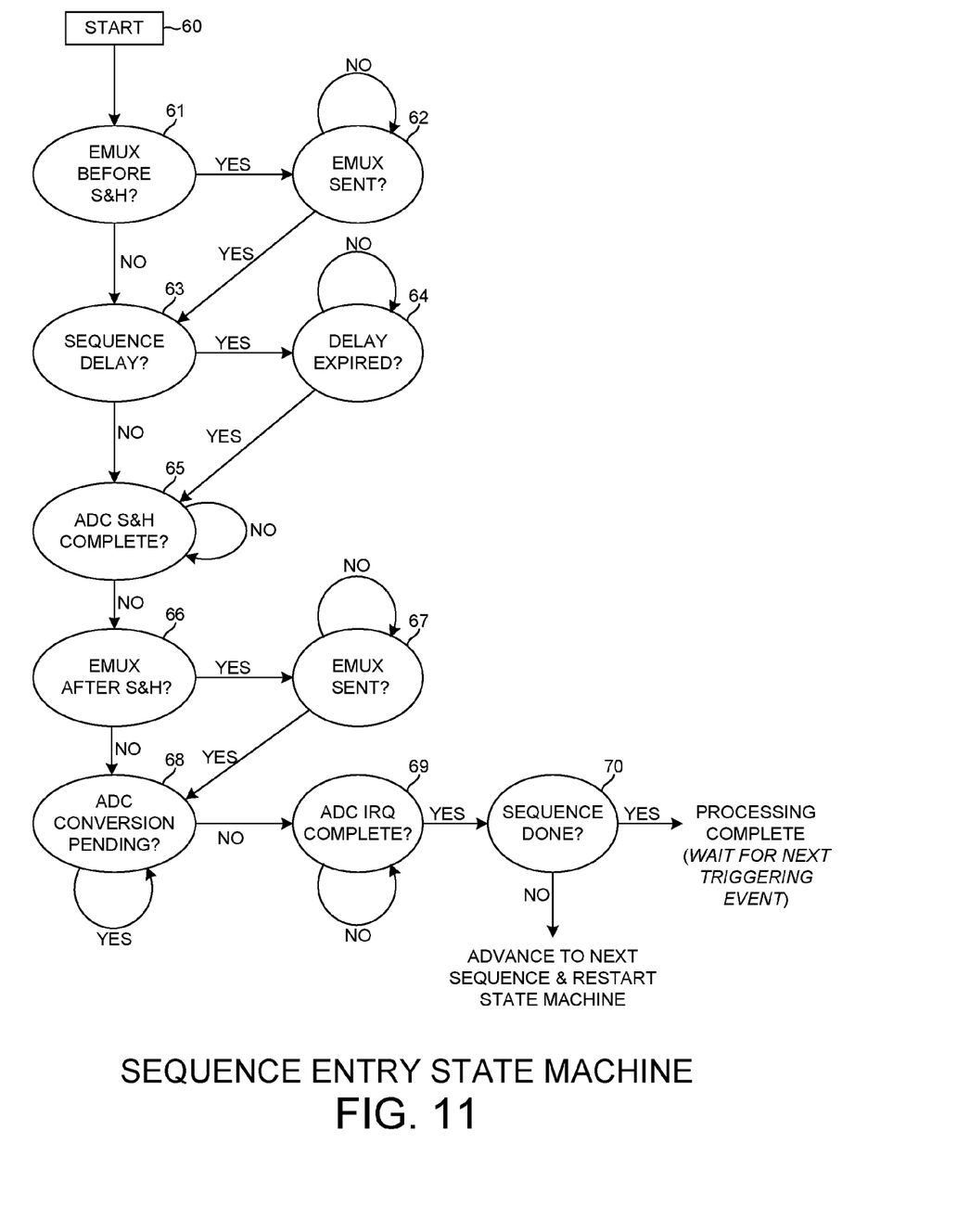
FIG. 11 is a state machine diagram illustrating the operation of a Sequence Entry State machine performed by the DTSE.

Once a sequence entry is read from the sequence configuration table, the sequence entry state machine illustrated in FIG. 11 is started (step 60). In step 61, it is determined if signaling (EMUX) is to be sent before sample and hold (S&H) is required. If so, then it is determined if the signaling data (EMUX) has been sent in step 62. If the signaling data has been sent, then it is determined if a sequence delay is required in step 63. If so, then it is determined if the delay has expired in step 64. If the delay has expired, then it is determined if the ADC sample and hold is complete in step 65. If so, then it is determined if signal is required after the ADC sample and hold is complete in step 66. If so, it is determined if the EMUX signaling data has been sent in step

67. If the signaling data has been sent, then it is determined if the ADC conversion is still pending in step 68. If not, then it is determined if the ADC interrupt (IRQ) is completed in step 69. If so, then it is determined if the sequence is done in step 70. If the sequence is done, then the process is complete and the sequence entry state machine waits for the next triggering event. If the sequence is not done, then the state machine advances to the next sequence and goes back to step 60.

Figure 6:
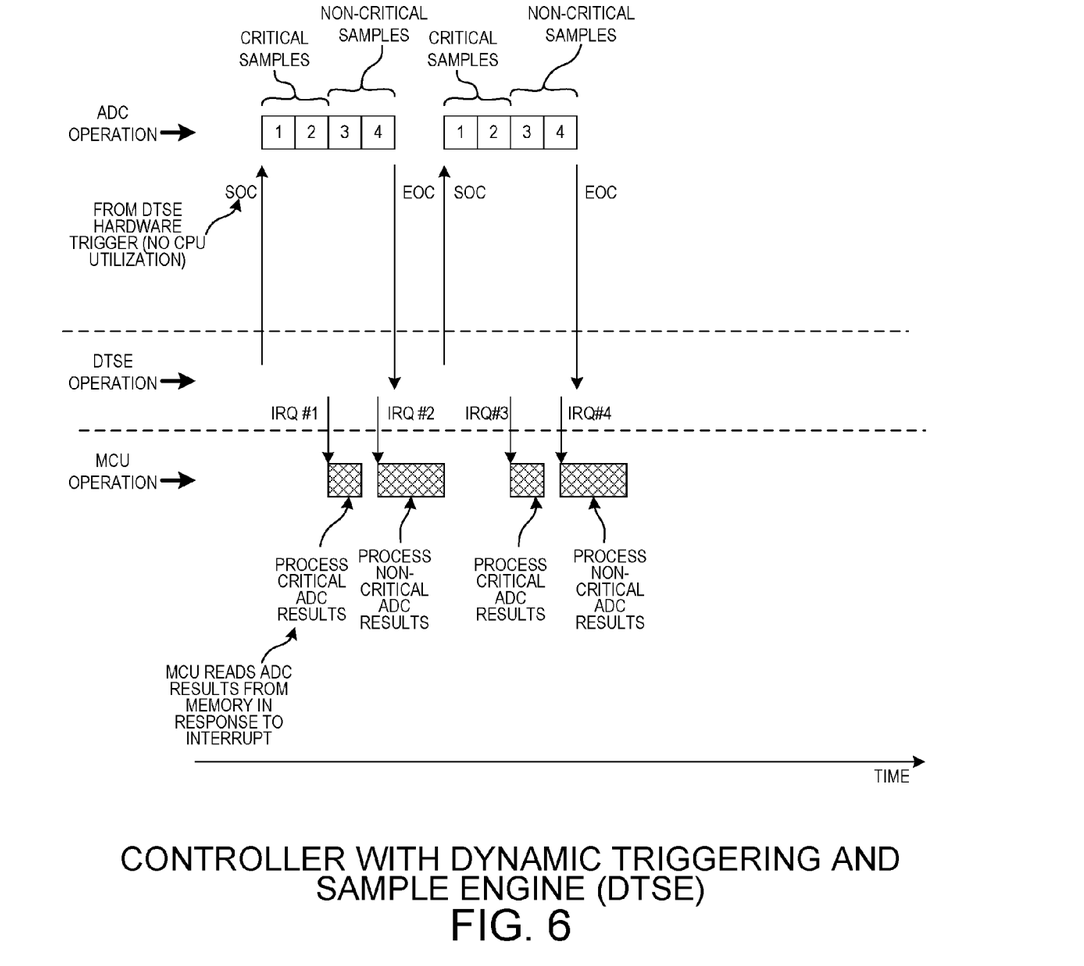
FIG. 6 is a diagram illustrating the operation of a controller with DTSE.

The operation of the controller with DTSE is illustrated in FIG. 6 in conjuncture with FIGS. 4 and 5. First, the DTSE 14 detects a trigger event on one of the trigger input pins 17. As discussed above, using the trigger mapping table the DTSE 14 determines a sequence entry number that is associated with the trigger input. The DTSE 14 then using the sequence entry number to read a particular set of sequence configuration values from the sequence configuration table. The DTSE 14 then uses the sequence configuration information to configure multiplexer 12, ADC 13 and send any required interrupts or data to processor 15. Once the multiplexer 12 and ADC 13 are properly configured, the DTSE 14 sends a START OF CONVERSION signal to the ADC 13. It is important to point out that the START OF CONVERSION signal is sent by the DTSE 14 not the processor 15 (MCU). This allows the analog sampling process to begin without disrupting the processing performed by the processor 15 or waiting (latency) for the processor 15 to complete a pending process before starting the analog-to-digital conversion. In response to receiving the START OF CONVERSION signal, the ADC 13 begins the sequence of analog-to-digital conversions. In the example illustrated in FIG. 6, the first two analog samples of the sequence are determined to be critical and the last two analog samples of the sequence are determined to be non-critical. This means that in an ideal situation, the processor 15 would be able to begin processing the critical analog samples before the non-critical analog samples are completed. The DTSE 14 achieves this design goal by issuing an interrupt to the processor 15 indicating the ADC 13 result for the critical analog samples are available in the sequence result table for processing before the non-critical samples are completed. In this fashion, the processor 15 is able to process critical analog samples immediately without waiting for the non-critical analog samples included in the sequence to be completed. Once the non-critical analog samples are completed, the DTSE 14 may issue a second interrupt (IRQ #2) to the processor 15 indicating that the non-critical analog samples are ready for processing.

In one embodiment, the DTSE outputs an interrupt signal after the completion of each sample. In another embodiment, the DTSE outputs a first interrupt after all critical samples are completed and a second interrupt after all non-critical samples are completed. The method in which the DTSE outputs interrupt signals is controlled by the IRQ (interrupt) value programmed into the sequence configuration table. The DTSE interrupt operation can be changed by updating the IRQ value stored in the sequence configuration table for a given sequence configuration table entry number.

Another advantage provided by the controller with DTSE is that the DTSE may start another sequence of conversions before the processor completes processing of analog samples from the previous sequence of conversions. In this fashion, the DTSE can start the next sequence promptly after the termination of the previous sequence, such that the critical samples of the next sequence are available for processing as soon as the processor finished processing of the previous sequence of analog samples. This allows the processor to process analog samples in the most efficient manner without wasting cycles determining configuration settings, controlling multiplexer and ADC configuration, and ADC result storage management.

Figure 12:
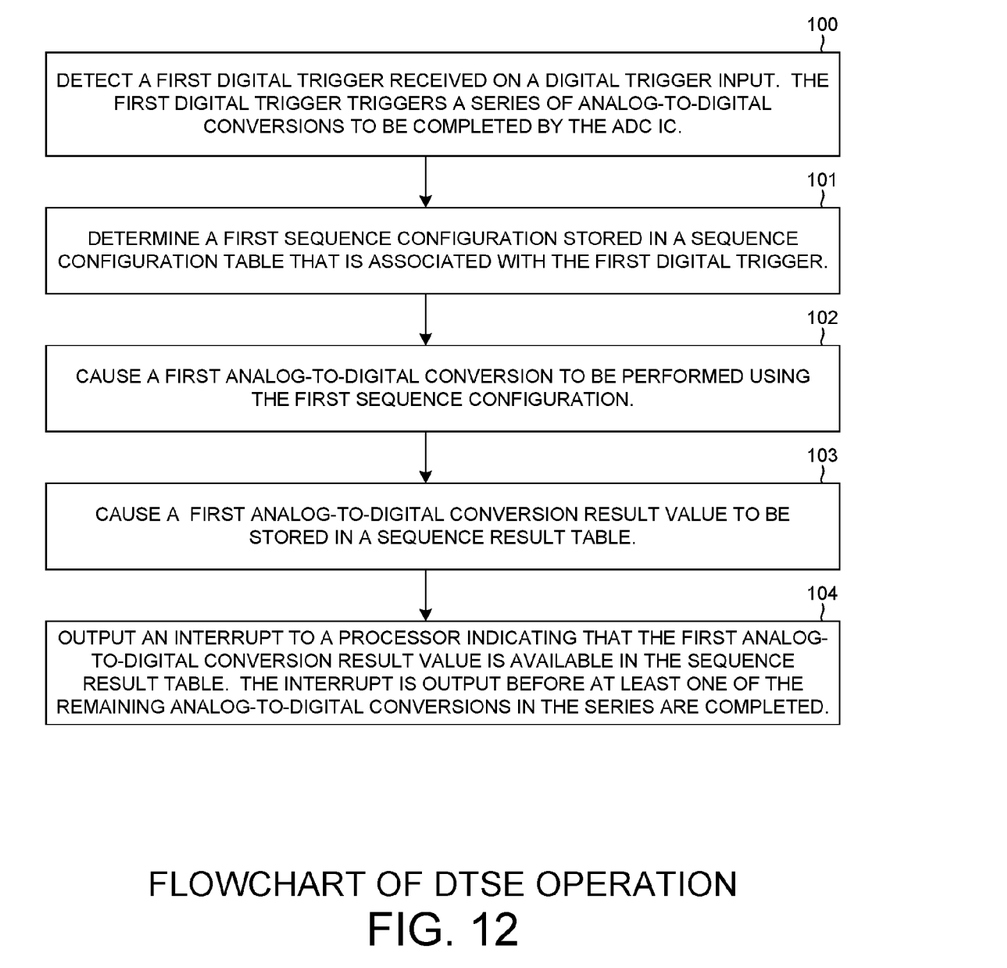
FIG. 12 is a flowchart describing the operation of the DTSE.

FIG. 12 is a flowchart describing the operation of the DTSE. In step 100, the DTSE detects a first trigger received on a trigger input. The first trigger triggers a series of analog-to-digital conversions to be completed by the ADC circuit. In step 101, the DTSE determines a first sequence configuration stored in a sequence configuration table that is associated with the first trigger. In step 102, the DTSE causes a first analog-to-digital conversion to be performed using the first sequence configuration. In step 103, the DTSE causes an analog-to-digital conversion result value to be stored in a sequence result table. In step 104, the DTSE outputs an interrupt to a processor indicating that the first analog-to-digital conversion is complete and that the result value is available in the sequence result table. The interrupt is output before at least one of the remaining analog-to-digital conversions in the series is completed.

Although certain specific embodiments are described above for instructional purposes, the teachings of this patent document have general applicability and are not limited to the specific embodiments described above. Accordingly, various modifications, adaptations, and combinations of various features of the described embodiments can be practiced without departing from the scope of the invention as set forth in the claims.

What is claimed is:

1. A Dynamic Triggering and Sample Engine (DTSE), comprising:
   a hardware trigger input;
   a bus terminal;
   a memory that stores a trigger mapping table, a sequence configuration table, and a sequence result table; and
   a state machine, wherein the state machine is configured to:
      detect a first trigger received on the hardware trigger input, wherein the first trigger triggers a series of analog-to-digital conversions to be completed by an analog-to-digital converter circuit;
      determine a first sequence configuration stored in the sequence configuration table that is associated with the first trigger;
      cause one of the first analog-to-digital conversions to be performed using the first sequence configuration;
      cause a first analog-to-digital conversion result value to be stored in the sequence result table; and
      output an interrupt indicating that the first analog-to-digital conversion has been completed by the analog-to-digital circuit, wherein the interrupt is output before at least one of the remaining analog-to-digital conversions in the series is completed, wherein the series of analog-to-digital conversions includes critical samples and non-critical samples, and wherein at least one of the critical samples is completed before at least one of the non-critical samples.

2. The DTSE of claim 1, wherein the interrupt is output after at least one of the critical samples of the series of analog-to-digital conversions are completed.

3. The DTSE of claim 1, wherein the interrupt is output after at least one of the non-critical samples of the series of analog-to-digital conversions are completed.

4. A Dynamic Triggering and Sample Engine (DTSE), comprising:
   a hardware trigger input;
   a bus terminal;

a memory that stores a trigger mapping table, a sequence configuration table, and a sequence result table; and
a state machine, wherein the state machine is configured to:
detect a first trigger received on the hardware trigger input, wherein the first trigger triggers a series of analog-to-digital conversions to be completed by an analog-to-digital converter circuit;
determine a first sequence configuration stored in the sequence configuration table that is associated with the first trigger;
cause one of the first analog-to-digital conversions to be performed using the first sequence configuration;
cause a first analog-to-digital conversion result value to be stored in the sequence result table; and
output an interrupt indicating that the first analog-to-digital conversion has been completed by the analog-to-digital circuit, wherein the interrupt is output before at least one of the remaining analog-to-digital conversions in the series is completed, wherein the series of analog-to-digital conversions includes critical samples and non-critical samples, wherein at least one of the critical samples is completed before at least one of the non-critical samples, and wherein the trigger mapping table is programmed by another device via the bus terminal.

5. A Dynamic Triggering and Sample Engine (DTSE), comprising:
a hardware trigger input;
a bus terminal;
a memory that stores a trigger mapping table, a sequence configuration table, and a sequence result table; and
a state machine, wherein the state machine is configured to:
detect a first trigger received on the hardware trigger input, wherein the first trigger triggers a series of analog-to-digital conversions to be completed by an analog-to-digital converter circuit;
determine a first sequence configuration stored in the sequence configuration table that is associated with the first trigger;
cause one of the first analog-to-digital conversions to be performed using the first sequence configuration;
cause a first analog-to-digital conversion result value to be stored in the sequence result table; and
output an interrupt indicating that the first analog-to-digital conversion has been completed by the analog-to-digital circuit, wherein the interrupt is output before at least one of the remaining analog-to-digital conversions in the series is completed, wherein the series of analog-to-digital conversions includes critical samples and non-critical samples, wherein at least one of the critical samples is completed before at least one of the non-critical samples, and wherein the DTSE and the analog-to-digital converter circuit are both fabricated on a single integrated circuit.

6. The DTSE of claim 1, wherein the DTSE and a processor circuit are both fabricated on a single integrated circuit, and wherein the interrupt is communicated from the DTSE to the processor circuit.

7. The DTSE of claim 1, wherein each sequence configuration stored in memory is associated with a unique entry in the sequence result table.

8. The DTSE of claim 1, wherein the state machine is implemented using a microcontroller.

9. The DTSE of claim 1, wherein the state machine is implemented using combinatory logic.

10. The DTSE of claim 1, wherein the bus is an Advanced Microcontroller Bus Architecture (AMBA) bus.

11. The DTSE of claim 1, wherein the Dynamic Triggering and Sample Engine (DTSE) includes a plurality of hardware trigger inputs.

12. A Dynamic Triggering and Sample Engine (DTSE), comprising:
a hardware trigger input;
a bus terminal;
a memory that stores a trigger mapping table, a sequence configuration table, and a sequence result table; and
a state machine, wherein the state machine is configured to:
detect a first trigger received on the hardware trigger input, wherein the first trigger triggers a series of analog-to-digital conversions to be completed by an analog-to-digital converter circuit;
determine a first sequence configuration stored in the sequence configuration table that is associated with the first trigger;
cause one of the first analog-to-digital conversions to be performed using the first sequence configuration;
cause a first analog-to-digital conversion result value to be stored in the sequence result table; and
output an interrupt indicating that the first analog-to-digital conversion has been completed by the analog-to-digital circuit, wherein the interrupt is output before at least one of the remaining analog-to-digital conversions in the series is completed, wherein the DTSE can be configured to detect a rising edge of a Pulse Width Modulate (PWM) signal on the hardware trigger input or a Pulse Width Modulate (PWM) signal on the hardware trigger input.

13. The DTSE of claim 1, wherein the memory comprises a plurality of storage devices.

14. A method of dynamic triggering, comprising:
(a) detecting a first trigger received on a hardware trigger input, wherein the first trigger triggers a series of analog-to-digital conversions to be completed by an analog-to-digital converter circuit;
(b) determining a first sequence configuration stored in a sequence configuration table that is associated with the first trigger;
(c) causing a first analog-to-digital conversion to be performed using the first sequence configuration;
(d) causing a first analog-to-digital conversion result value to be stored in a sequence result table; and
(e) outputting an interrupt indicating that the first analog-to-digital conversion result value is available in the sequence result table, wherein the interrupt is output before at least one of the analog-to-digital conversions in the series are completed, and wherein the outputting of (e) further comprises:
(e1) determining a first portion of the series of analog-to-digital conversions that are critical conversions;
(e2) determining a second portion of the series of analog-to-digital conversions that are non-critical conversions; and
(e3) outputting the interrupt after at least one of the critical conversions are completed and before the non-critical conversions are completed.

15. The method of claim 14, wherein the first analog-to-digital conversion result value is the result of performing the first analog-to-digital conversion.

16. The method of claim 14, wherein the steps (a) through (e) are performed by a state machine included in a Dynamic Triggering and Sample Engine (DTSE).

17. The method of claim 14, further comprising receiving the first sequence configuration from a bus.

18. The method of claim 14, further comprising communicating the first analog-to-digital conversion result value across a bus.

\* \* \* \* \*